United States Patent [19]
Van Anrooy

[11] 3,913,020
[45] Oct. 14, 1975

[54] ELECTRONIC TELEVISION TUNING SYSTEM

[75] Inventor: Peter Van Anrooy, Itasca, Ill.
[73] Assignee: Quasar Electronics Corporation, Franklin Park, Ill.

[22] Filed: Nov. 29, 1974
[21] Appl. No.: 528,077

[52] U.S. Cl. ................ 325/453; 325/459; 325/470; 334/16
[51] Int. Cl.$^2$ ............................................ H04B 1/16
[58] Field of Search ........... 325/453, 457, 459, 468, 325/470, 423; 334/15, 16, 18, 26

[56] References Cited
UNITED STATES PATENTS
3,803,495 4/1974 Reynolds ........................... 325/470

*Primary Examiner*—Albert J. Mayer
*Attorney, Agent, or Firm*—LaValle D. Ptak; Drummond, Nelson & Ptak

[57] ABSTRACT

An electronic television tuning system employs a single oscillator as the sole local oscillator for all VHF and UHF channels and also as part of a frequency synethesizer system used to select and maintain the desired tuning frequency in accordance with a selected channel number. The oscillator output in the synthesizer portion is supplied through a combfilter with a 6 MHz fundamental response, so that it produces sharply increased output "blips" each time that the output of the oscillator reaches a multiple of 6 MHz. These output blips are counted in an electronic counter and are compared in a comparison circuit with a corresponding number which is derived from the channel number selection to produce an output indicative of the number of blips necessary to reach the frequency for the desired channel. When the proper number of blips are counted, the oscillator frequency scan is stopped. A phase-locked loop responsive to the output of the oscillator and to the output of the combfilter then is utilized to maintain the frequency of the oscillator at the selected frequency. Transmission gates and frequency dividers selected by a band-select circuit determine the actual signal frequency applied to the IF mixer.

16 Claims, 2 Drawing Figures

ELECTRONIC TELEVISION TUNING SYSTEM

BACKGROUND OF THE INVENTION

Television receivers in the past have commonly employed relatively cumbersome and complex mechanical turret type tuners for tuning the VHF channels, with a different rotary or continuous tuning provision for the UHF channels. Some receivers have used a detented tuner for the UHF channels, but the large number of possible UHF channels (70) makes the tuner very difficult and expensive to manufacture if capability of precisely tuning to any UHF channel is provided. To overcome this problem some UHF tuners reduce the number of possible channels which can be tuned by the UHF tuner and are then uniquely programmed for the UHF channels transmitted in the particular locality in which the receiver is to be used. This, of course, does not provide full compatability between the UHF and VHF tuning and results in an added service adjustment at the time the television set is delivered and set up in a particular locality.

Mechanical tuners also occupy a relatively large amount of space immediately behind the front panel of the television receiver. This restricts the design flexibility of the receiver cabinets. In addition, adjustment of such mechanical tuners to maintain accurate tuning is a problem; and if remote control capability is desired, this generally requires a drive motor for rotating the mechanical parts under the control of the remote signals.

The advent of voltage variable capacitor or varactor VHF and UHF tuners has opened the way for utilization of electronic tuning of television receivers. While such tuners solve many of the problems inherent in mechanical tuners, the problems of tuning voltage stability and channel selection still exist. In many such tuners, even in the channel selection area, most systems require some type of individual pre-programming for the UHF channels to adapt the television receiver for the particular locality in which it is used.

Systems have been proposed employing frequency synthesized tuning systems which generate a wide spectrum of RF signals, spaced by intervals equal to the fundamental oscillator frequency from which they are derived, for example, 6 megahertz (MHz) for television UHF tuning. Systems of this type, however, cause undesirable radiation and interference because of the many spectral components which are derived from the reference oscillator. Another disadvantage of such a system is the complication of the phase-locked loop systems which are needed to hold the controllable oscillator at the correct frequency with reference to the desired one of the many frequency components derived from the reference oscillator. In such a system, the local oscillator frequency is swept from a predetermined minimum frequency, and its output is compared with the spectrum of signals supplied by the synthesizer system. Each time the sweep reaches one of the spectrum signals, the phase detector produces a sharp change in its output. These changes may be counted and fed to a programmed counter supplied with the channel selection code for the desired channel to stop the ramp or scan of the voltage control oscillator at the desired frequency. Such a system has been proposed for use in tuning the UHF band of frequencies for a television receiver; but due to the non-uniform frequency spacings between channels four and five, between the highest channel in the low VHF band and the lowest channel in the high VHF band and also between the highest channel in the high VHF band and the lowest channel in the UHF band, such systems have not been used for tuning all bands of the receiver.

Another system which has been proposed is a system employing additional stable oscillators producing output frequencies uniquely related to the different portions of the low and high VHF bands and to the UHF band. These oscillators are used to pre-scale the output frequencies of the VHF and UHF tuner local oscillators to different frequency ranges to produce a signal which can be employed in a programmable divide-by-N counter to produce an output which may be compared with a reference frequency to produce the control voltage for the tuner local oscillators. The disadvantage of this system is that it requires a large number of oscillators, which substantially increases the cost of the tuning system, even though the disadvantages of the multiplicity of the spectral components of the above synthesizer tuning system are not present.

It is desirable to produce an electronic tuning system for a television receiver which is capable of selecting any channel in any of the VHF and UHF bands and further which uses a single local oscillator for all bands. The oscillator should produce only one output signal frequency at a time; thereby minimizing undesirable radiation and interference within the television receiver.

SUMMARY OF THE INVENTION

Accordingly, it is an object of this invention to provide an improved tuner control system.

It is another object of this invention to provide an improved electronic tuning system.

It is an additional object of this invention to provide an improved channel selection system for a television receiver.

It is a further object of this invention to provide an improved channel selection system for a television receiver using a single local oscillator for multiband tuning.

It is yet another object of this invention to utilize an improved frequency synthesizer system in a channel selection system for a television receiver.

It is still another object of this invention to provide an improved channel selection tuner control system for a television receiver which is capable of selecting any channel in any band.

These and other objects are accomplished in accordance with a preferred embodiment of this invention in which a frequency selector system for tuning a television receiver includes a voltage controlled local oscillator to supply signals to the receiver mixer. This oscillator also supplies signals to a combfilter having a fundamental response frequency equal to the frequency spacing (*f*) between the UHF channels. The combfilter produces sharply changed output signals levels for all oscillator output frequencies which are an integer multiple (*nf*) of that frequency spacing.

When a channel is selected, the operation of a sweep generator is initiated to cause the local oscillator frequency to sweep upwards from a predetermined minimum frequency. Each time a frequency *nf* is reached by the oscillator, the filter output changes and causes a counter coupled to the filter circuit to count the change of output signal level. Selection of the desired channel number is translated into a representative count which is compared with the output of the counter. When coincidence exists, the sweep generator operation is terminated. The oscillator thereafter is held at the desired frequency by a phase-locked loop responsive to the oscillator output and the output of the combfilter to maintain the oscillator frequency at the frequency it reached at the time the ramp generation was stopped.

In more specific embodiments of the invention, the oscillator output also is applied through a first transmission gate which is enabled for UHF channels by the channel selection circuit. If a high VHF channel is selected, a second transmission gate is enabled and the oscillator output passes through a divide-by-3 frequency divider to supply the high band VHF signals to the mixer through the second transmission gate. Similarly, low band VHF channels supply signals divided by 6 from the oscillator through a third transmission gate to the mixer. Thus, only a single oscillator is employed both as the local oscillator and as part of the frequency synthesizer circuit used to determine the correct tuning of the receiver.

DETAILED DESCRIPTION

Figure 1:
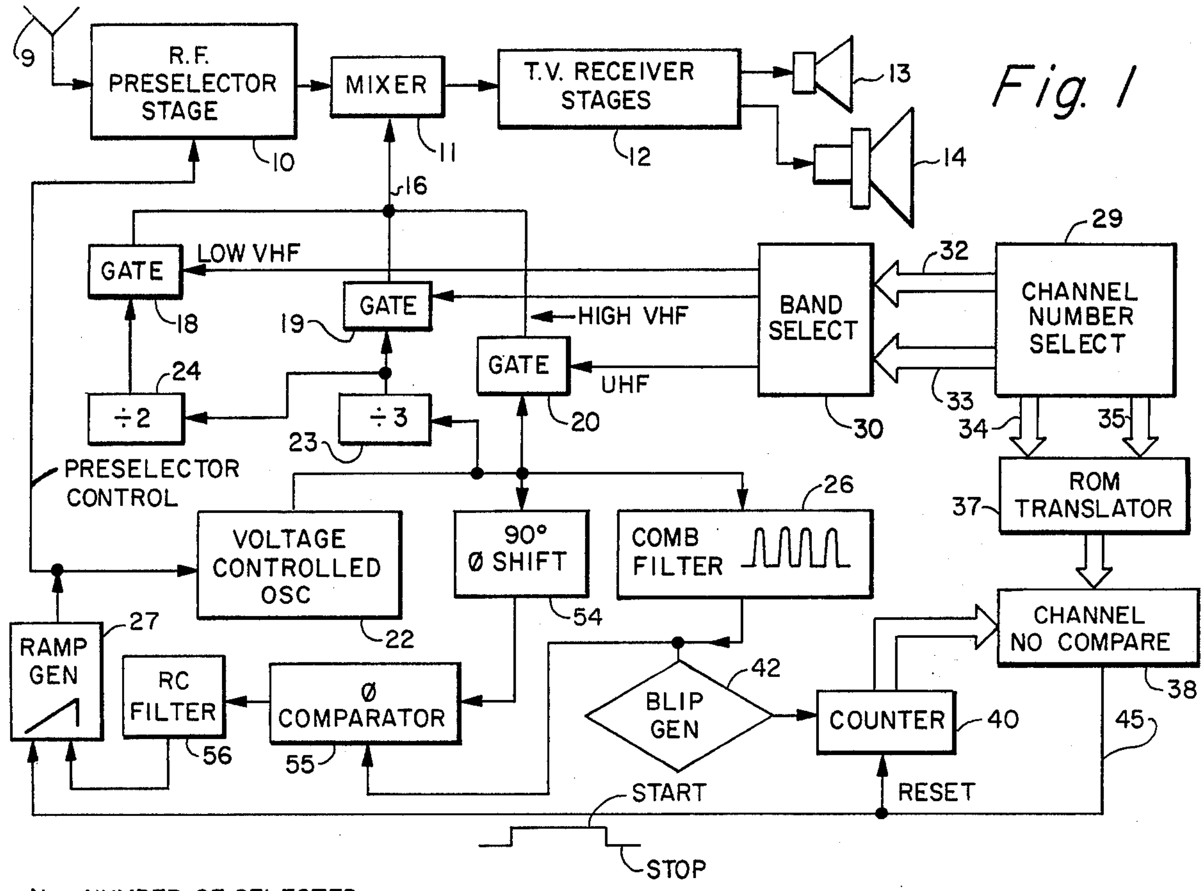
FIG. 1 is a block diagram of a system according to a preferred embodiment of the invention.

Referring now to the drawing, FIG. 1 shows a block diagram of a television receiver circuit employing a tuning system in accordance with a preferred embodiment of this invention. Incoming signals are received on an antenna 9 which supplies the signals to an RF pre-selector stage 10. The output of the RF pre-selector stage is supplied to a mixer 11 which in turn supplies the television IF signals to the conventional receiver stages 12 for either a black and white or color television receiver. Outputs of the receiver stages 12 are supplied to a loudspeaker 13 and to a cathode ray tube 14 to produce sound and picture in accordance with well-known conventional practices.

To produce the television IF signal in the mixer 11, the received RF signals from the pre-selector stage 10 are mixed with a local oscillator signal applied to the mixer 11 on a lead 16. The oscillator signal on the lead 16 is obtained from one of three transmission gates 18, 19 and 20 which correspond to the low VHF band, high VHF band, and UHF band of received signals, respectively. Only one of these gates is enabled to pass signals through it from a voltage controlled local oscillator 22 at any one time.

The signals from the oscillator 22 applied to the gate 20 are passed through at the frequency of operation of the oscillator. The signals for the gates 19 and 18, however, are divided by frequency dividers 23 and 24, the divider 23 being a divide-by-3 divider, so that the frequency of the signals passed by the gate 19 are one-third the frequency of those produced by the voltage controlled oscillator 22. The divider 24 is a divide-by-2 divider which receives its input from the output of the divider 23, so that the oscillator signals passed by the gate 18 are divided by 6 or are at one-sixth the frequency of the signals supplied from the output of the voltage controlled oscillator 22. The reason for this is explained subsequently in conjunction with the description of the operation of the frequency selection system for the tuning system which is disclosed.

By use of this technique, it is possible to use a single voltage controlled oscillator 22 as the local oscillator for both parts of the VHF signal band and for the UHF signal band in contrast to conventional approaches which require different local oscillators for each of the bands to which the television receiver is capable of being tuned.

In addition to providing the local oscillator signal to the mixer 11 on the lead 16, the voltage controlled oscillator 22 also is operated as the oscillator of a frequency synthesizer network, which is utilized to control the tuning of the television receiver to the desired channel. The synthesizer operation of the oscillator 22 is effected simultaneously with the customary superheterodyne function performed by the oscillator in conjunction with the mixer 11.

A portion of the oscillator output signal is applied through a combfilter 26, which preferably is a surface acoustic wave filter (SAW filter), selected to have a fundamental frequency response of 6 MHz. This frequency is chosen since it is the frequency spacing between the channels in the UHF band of the standard FCC signals utilized in the United States (for CCIR TV the frequency is 7 MHz and for such CCIR systems the fundamental frequency response of the filter 26 would be selected to be 7 MHz). The combfilter produces a first response peak at its fundamental frequency *f*, and thereafter the filter response also shows a peak for every integer harmonic *nf* where *n* equals 1, 2, 3, . . . infinity. SAW filters exhibit a relatively flat loss over the pass range of interest (the UHF frequency band) and also exhibit a flat delay. In the case of a system used with the FCC established channel spacing, the delay is one-sixth microsecond (166.67 nanoseconds). The flat passband of the filter 26 is between 515 and 931 MHz.

The operation of the system will be described initially for the UHF television frequency band. As is well known, the standard FCC UHF television frequency band is assigned from 470 MHz to 890 MHz. The center frequency for channel 14 is at 473 MHz, and each successive UHF channel is 6 MHz higher, with the center frequency for channel 83 at 887 MHz. The main carrier frequency (the picture carrier frequency) of UHF channel 14 is 471.25 MHz and that of channel 83 is 885.25 MHz.

The local oscillator frequency commonly employed for channel 14 in the present TV standards is 517 MHz, which results in an IF carrier frequency of 45.75 MHz. If the standard IF frequency of 45.75 MHz is lowered to 44.75 MHz, the local oscillator frequency for channel 14 than is 516 MHz which is the 86th harmonic of 6 MHz, the channel frequency spacing for the UHF television band. As a consequence, all desired subsequent UHF local oscillator frequencies are multiples of 6 MHz because of the standard 6 MHz spacing. This change in the IF carrier frequency can be readily implemented and permits utilization of the simplified tuning system shown in FIG. 1.

With these preliminaries in mind, consider a starting condition where a ramp function generator 27, having its output connected to the control input of the voltage controlled oscillator 22, is at rest, providing a minimum output voltage to the oscillator 22. With this minimum output voltage applied to the oscillator 22, it operates at its predetermined lowest frequency which is of the order of 514 or 515 MHz, less than the 516 MHz frequency for channel 14 but not less than 510 MHz.

If a UHF channel number is then selected by a channel number selection circuit 29, a band select circuit 30 senses the "tens" and "units" outputs from the channel number selection circuit 25 and decodes these numbers indicative of a UHF channel to enable the UHF gate 20. At the same time, the gates 18 and 19 are disabled, so that only the gate 20 passes signals from the voltage controlled oscillator 22. The channel number selection circuit 29 can be a suitable pushbutton selection circuit having a set of buttons for each of the tens and units digits for indicating any channel to which the television receiver can be tuned. The outputs of the tens and units digits are applied respectively over multiple inputs 32 and 33 to the band select circuit 30, which comprises conventional coincidence and OR gate circuits responsive to the selected channel numbers for enabling the desired one of the gates 18, 19 and 20 corresponding to the band of frequencies in which the selected channel lies.

Corresponding outputs representative of the tens and units numbers selected also are applied respectively over groups of leads 34 and 35 to a read only memory (ROM) translator circuit 37. The ROM translator 37 is of conventional configuration and decodes the selected channel number to supply an output to a channel number comparison circuit 38 which is representative of a predetermined count which corresponds to that channel number. The other inputs to the channel number comparision circuit 38 are obtained from a binary counter circuit 40, which receives input pulses from a "blip" generator 42 coupled to the output of the combfilter 26.

As soon as a new channel number is entered into the channel number selection circuit 29, the output of the ROM translator 37 applied to the channel number comparison circuit 38 causes the outputs of the channel number comparison circuit 38 to indicate a failure of comparison between the output of the ROM translator 37 and that of the counter 40. This results in an output signal applied over a lead 45 to reset the counter 40.

In the ramp generator 27 this signal on the lead 45 resets the ramp to an initial low DC voltage and initiates (starts) generation of a sawtooth ramp signal by the generator 27. This ramp of increasing DC voltage is applied to the voltage controlled oscillator 22 to cause its frequency to be swept upward. The sweep rate is optional, but a typical reate would be approximately 1/30th of a second to sweep the oscillator 22 from its lowest frequency, 515 MHz, to its highest frequency, for example 931 MHz.

Each time the frequency of the oscillator 22 passes a harmonic frequency of 6 MHz, i.e., $nf$ where $f$ is 6 MHz, the output of the combfilter 26 increases sharply. These increases are detected to the blip detector or generator 42, which can be a differentiating circuit, which produces an output pulse each time the local oscillator frequency reaches a multiple of 6 MHz.

The output pulses from the blip generator 42 are counted in a relatively slow logic binary counter 40, since the rate of the pulses applied to the counter is of the order of 2100 hertz. For the UHF channel the counts are easily identified, the first count or count 1 is representative of channel 14 since the first blip is obtained when the oscillator frequency first reaches 516 MHz. Similarly, the 69th count is indicative of channel 83. For the UHF channels, the ROM translator 37 provides an output indicative of a binary count of 1 when channel 14 is selected and similarly provides an output indicative of binary number 69 for channel 83, with comparable outputs for each of the other UHF channels.

The binary number inputs from the ROM translator 37 are compared with the binary number outputs from the counter 40. When the two numbers correspond, a change in the output signal is obtained from the channel number comparison circuit 38 and is applied over the lead 45 to stop further operation of the ramp generator and hold it at the voltage which produced the correspondence. This condition remains until the next start pulse is applied over the output lead 45 from the comparision circuit 38 to reset the generator 27 and initiate a new ramp.

The output frequency from the voltage controlled oscillator is applied through the gate 20 to the leads 16 and the mixer 11 and is the desired frequency for the selected UHF channel, which was reached when the channel number comparison circuit stopped the operation of the ramp generator 27. The frequency of the voltage controlled oscillator is maintained at this point by a phase-locked loop responsive to the output of the oscillator 22 which is shifted by a 90° phase-shift circuit 54 and applied to one input of a phase-comparator 55. The other input of the phase-comparator 55 is obtained from the output of the combfilter 26, and the output of the comparator 55 is applied through an R-C filter network 56 to produce a DC control voltage applied to a control input of the ramp generator 27 to vary its output voltage in a manner to maintain the desired output frequency of the oscillator.

In this mode of the operation of the system, the phase-comparator 55 takes over control of the voltage controlled oscillator 22 and locks its frequency at that point. During the frequency sweeping operation, the output of the phase-comparator 55 is overridden by the ramp generator 27 when it is forcing the voltage controlled oscillator 22 to sweep in frequency from its minimum frequency upward to the desired tuning frequency.

Assume now that a channel number is entered into the channel number selection circuit 29 which corresponds with one of the high band VHF channels, namely, one of channels 7 through 13. The operation of the band select switch circuit 30 at this time then causes the transmission gate 19 to be enabled to pass signals through it and gates 18 and 20 are disabled. The ROM translator also produces an output indicative of a count which corresponds to the selected channel number. The operation of the system is otherwise the same as described above in conjunction with selection of a UHF channel. The ROM translator 37 is programmed to recognize the VHF channels to produce an output count for comparison with the output of the counter 40 by the channel number comparison circuit 38 such that the 25th count, or a count of 25 is identified as channel 7, counts 26 and 27 are ignored and count 28 is identified as channel 8, counts 29 and 30 are ignored and count 31 is identified as channel 9, etc., so that channel 13 is identified by a count of 43 blips by the counter 40.

It should be noted that the same number of 25 blips, which are counted for channel 7, are also used to identify UHF channel 38; but since the UHF gate 20 is disabled at this time, only the gate 19 supplied with the divided-by-3 output frequency of the voltage controlled oscillator 22 passes signals to the mixer 11 on the lead 16 indicative of the proper high band VHF frequency for tuning to the desired channel. For example, for channel 7 after a count of 25 blips are reached, the master oscillator is operating at 660 MHz. This frequency is divided by 3, so that the output frequency passed by the transmission gate 19 is 220 MHz, which for the assumed IF carrier frequency of 44.75 MHz if the correct local oscillator frequency. A similar comparison and analysis can be made for each of the other high band VHF channels. When the counter output from the counter 40 corresponds with the count provided by the ROM translator 37 to the channel number comparison circuit 38, the operation of the ramp generator 27 is stopped, and control of maintaining the frequency of the voltage controlled oscillator is accomplished by the phase-locked loop comparator 55 in the manner described previously.

Assume now that the channel number selection circuit 29 is changed to enter a channel number corresponding to one of the low-band VHF channels 2 through 6. Once again, when this is done, the ROM translator 37 decodes the selected channel number to a count which corresponds to the desired count needed to be reached by the counter 40 to cause the correct frequency to be passed by the low VHF band transmission gate 18. The gate 18 is enabled by a decoding of a low-band VHF signal in the band select circuit 30 and the gates 19 and 20 are disabled.

The signals now passed to the mixer 11 on the lead 16 are at a frequency which is divided by 6 from the frequency produced by the oscillator 22, since the frequency is divided first by 3 in the divider 23 and then by 2 in the divider 24, connected in series between the output of the voltage controlled oscillator 22 and the input to the transmission gate 18. As in the case when any new channel number is entered by the channel number selection circuit 29, the ramp generator 27 is set to start the ramp at the lowest frequency of the oscillator 22, and the counter 40 is reset. Now the ramp function generator 27 drives the voltage controlled oscillator frequency upward; and, as described previously, for any multiple of 6 MHz a blip is obtained from the output of the blip generator 42 and is counted by the counter 40.

The ROM translator 37 produces an output for the channel number comparison circuit 38 in response to low-band VHF circuit numbers to cause count number 15 to be identified as channel 2, to ignore counts 16 through 20, and to recognize count 21 as channel 3, to ignore counts 22 through 26 and to recognize count 27 as channel 4. The ROM logic also is programmed to ignore counts 28 to 36 and to recognize count 37 as channel 5, to ignore counts 38 to 42 and to recognize count 43 as channel 6. This difference in spacing is necessitated by the fact that channels 2, 3 and 4 are separated from one another by the standard 6 MHz channel spacing, but the spacing between channels 4 and 5 is a 10 MHz spacing in accordance with the FCC standards.

As stated previously, the frequency of the oscillator 22 is divided by 6 for the low VHF channels. From this it can be seen that count number 15 results in the voltage controlled oscillator 22 producing an output frequency of 600 MHz. When this frequency is divided by 6 it results in an oscillator frequency passed by the gate 18 of 100 MHz which is heterodyned in the mixer 11 with the standard picture carrier frequency of 55.25 MHz for channel 2 to produce the desired 44.75 MHz IF carrier frequency. Similarly, for channel 6, a count of 43 blips corresponds to a master oscillator frequency of 768 MHz. When this is divided by 6, it results in a signal frequency passed by the gate 18 of 128 MHz. When this frequency is mixed with the picture carrier of 83.25 MHz for channel 6, the desired 44.75 MHz IF carrier frequency is produced from the mixer 11. A comparable analysis and comparison can be made for the frequencies for each of the other low-band VHF channels with comparable results.

The system operates in the same manner for low-band VHF, high-band VHF and UHF channel number selection, with the operation of the band select switch 30 and the output of the ROM translator 37 causing signals at the proper frequency to be supplied to the mixer 11 for the desired channel number which is selected by the channel number selection circuit 29.

For similar local oscillator frequencies, a channel can be selected in more than one of these different bands. For example, a local oscillator frequency of 732 MHz is used for channel 5 in the low VHF band, channel 11 in high VHF band, and channel 50 in the UHF band. This frequency is reached by a count of 37 blips by the counter 40 and the ROM translator 37 provides an output to the channel number comparison circuit 38 corresponding to this count of 37 for each of these three selected channels. The determination as to which of these three channels is being selected by the tuner is effected by the band select circuit 30, which enables a different one of the transmission gates 18, 19 and 20, depending upon which of the three channels is selected by the channel number selection circuit 29. The decoding logic used to produce this result is straightforward coincidence logic employed within the band selection circuit 30.

The frequency relationships for the different channels and corresponding to the different blips or counts are given in the following Table I which clearly shows the relationships for the channel selection which has been discussed above. The relationships between the voltage controlled local oscillator frequencies, the different channels in the different bands, and the blip count is given for all VHF and UHF channels to which a televsion receiver can be tuned according to the present FCC standards.

TABLE I

| Voltage Controlled Oscillator F (MHz) | Low VHF Channels | High VHF Channels | UHF Channels | "Blips" |
|---|---|---|---|---|
| 516 | None | None | 14 | 1 |
| 522 | | | 15 | 2 |
| . | | | . | . |
| . | | | . | . |
| 594 | | | 27 | 14 |
| 600 | 02 | — | 28 | 15 |
| 636 | 03 | — | 34 | 21 |
| 660 | — | 07 | 38 | 25 |
| 672 | 04 | — | 40 | 27 |
| 678 | — | 08 | 41 | 28 |
| 696 | — | 09 | 44 | 31 |
| 714 | — | 10 | 47 | 34 |

TABLE I-Continued

| Voltage Controlled Oscillator F (MHz) | Low VHF Channels | High VHF Channels | UHF Channels | "Blips" |
|---|---|---|---|---|
| 732 | 05 | 11 | 50 | 37 |
| 750 | — | 12 | 53 | 40 |
| 768 | 06 | 13 | 56 | 43 |
| 774 | | | 57 | 44 |
| . | | | . | . |
| . | None | None | . | . |
| 930 | | | 83 | 70 |

Figure 2:
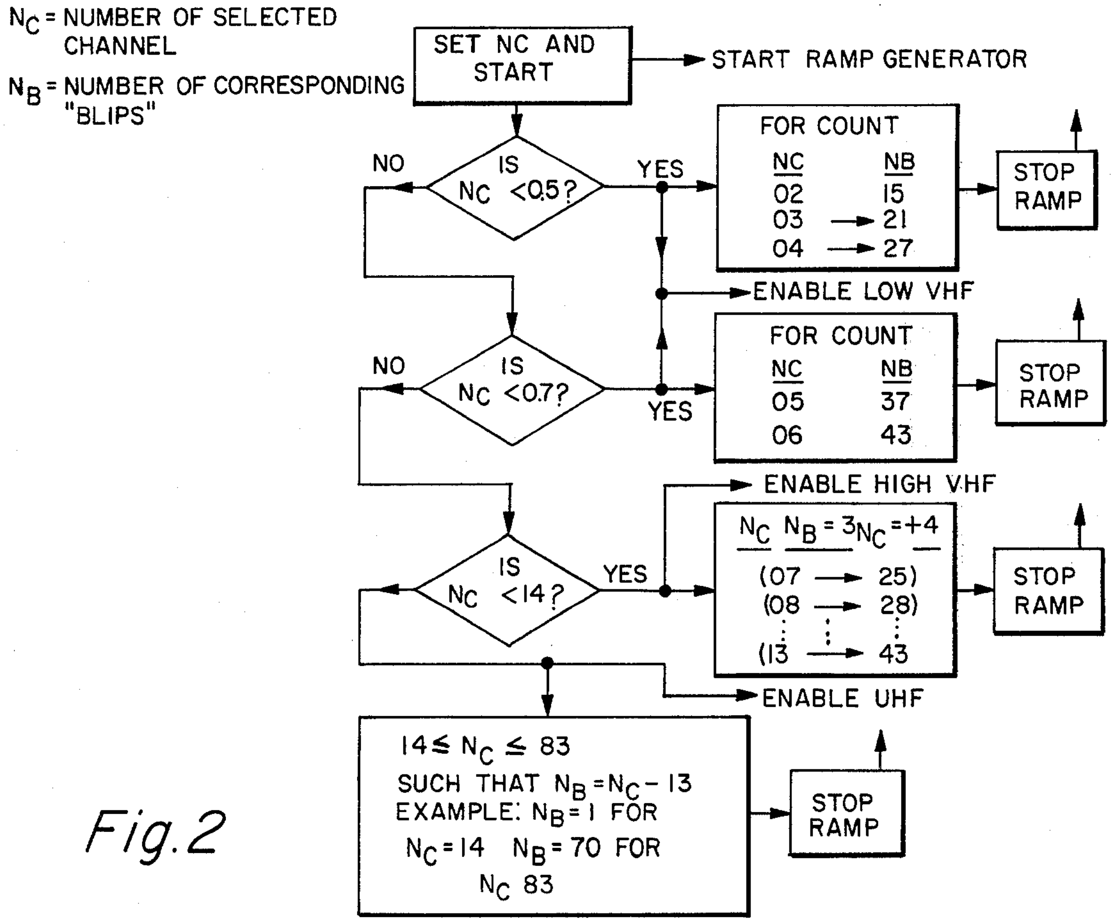
FIG. 2 is an algorithm useful in understanding the operation of the system shown in FIG. 1.

FIG. 2 shows an algorithm of the decoding decisions which are performed by the ROM translator 37 to produce the desired channel selection operation in accordance with the description given above. When the ROM translator 37 is programmed in accordance with the algorithm of FIG. 2 it operates in conjunction with the operation of the counter 40 and channel number comparison circuit 38 to stop the ramp generator at the proper frequency for the desired channel.

It is possible to use a single voltage controlled oscillator 22 for all bands of the standard television channel frequencies, since for every "low " VHF channel local oscillator frequency there is a sixth harmonic equal to an existing UHF local oscillator frequency. Similarly, for every "high" VHF channel local oscillator frequency there is a third harmonic equal to an existing UHF local oscillator frequency. Thus, utilization of an oscillator 22 capable of producing UHF frequencies, in conjunction with the dividers 23 and 24 permits tuning for all bands to be accomplished.

A similar result also could be obtained by utilizing a lower frequency range for the voltage controlled oscillator 22 and multiplying high-band VHF frequencies by 3 and low-band VHF frequencies by 6 before applying them to the mixer 11 and before applying them to the combfilter 26. If this change is made, the program of the ROM translator 37 also has to be adjusted accordingly; but the same decoding techniques are utilized except that the count of the blips for the different channels will not be the same as that given in the above table I.

If the power requirements of the system require it, the outputs of the dividers 23 and 24 may be applied through emitter-followers to the gates 19 and 18, respectively, to maintain a sufficient level of signal on the lead 16 to drive the VHF mixer 11 in the television system.

The system which has been described is an accurate and efficient all-band tuning system which can be implemented into a television receiver with a minimum number and size of parts.

I claim:

1. In a receiver including local oscillator means for producing signals at different frequencies for tuning the receiver to different received frequencies displaced from one another by a predetermined frequency spacing, a frequency selector system including in combination:

first circuit means coupled to the output of said local oscillator means and having a fundamental response frequency *f* equal to the frequency of said predetermined frequency spacing and producing sharply changed output signal levels for all frequencies *nf* where *n* is a whole number integer;

sweep means coupled with said local oscillator means for causing the signals from said local oscillator means to seep through a band of frequencies to cause said first circuit means output to change sharply for each frequency *nf;* counter means coupled to said first circuit means for counting the sharp changes in the output signal level of said first circuit means;

recognition means responsive to a predetermined count in said counter means for stopping said sweep means when the signal produced by said local oscillator means reaches a frequency having a predetermined relationship with such predetermined count;

phase comparator means having a first input coupled with the output of said oscillator means and having a second input coupled with the output of said first circuit means for supplying a control signal to said oscillator means for maintaining the frequency of said oscillator at the frequency reached when said sweep means is stopped.

2. The combination according to claim 1 further including means producing an output indicative of a selected channel number, and wherein said recognition means comprises a comparator means supplied with the output of said means for producing an output indicative of a selected channel number and supplied with the output of said counter means for stopping said sweep means when the count produced by said counter means corresponds with the output indicative of a selected channel number.

3. The combination according to claim 1 wherein said first circuit means is a combfilter.

4. The combination according to claim 3 wherein said combfilter is a surface acoustic wave filter.

5. The combination according to claim 1 wherein said local oscillator means comprises a voltage controlled oscillator, the output frequency of which is controlled by the application of a control voltage thereto; said sweep means is coupled to a control input of said voltage controlled oscillator and initially is reset to supply a control voltage to said oscillator of a magnitude causing the oscillator output frequencies to commence sweeping from a predetermined lowest frequency; and the output of said phase comparator means also is coupled to vary the voltage applied to the control input of said oscillator.

6. The combination according to claim 5 further including phase shift means coupled between the output of said voltage controlled oscillator and the first input of said phase comparator means.

7. The combination according to claim 5 wherein said sweep means produces a predetermined control voltage corresponding to said predetermined count when said sweep means is stopped by said recognition means for thereby maintaining said oscillator output frequency at said predetermined corresponding frequency.

8. A channel selector system for a television receiver including a local oscillator means for producing signals at different frequencies for tuning said receiver to different received frequencies displaced for one another by predetermined frequency spacings in at least two different bands, said channel selector system including in combination:

combfilter circuit means coupled to the output of said local oscillator means and having a fundamental response frequency equal to the predetermined frequency spacing $f$ of the received signals in at least one of said bands and producing sharply changed output signal levels for all frequencies $nf$, where $n$ is a whole number integer;

first and second transmission gate means each having an input and an output;

first frequency changing circuit means;

means for coupling the output of said local oscillator means with the input of said first transission gate means;

means for coupling the output of said local oscillator means through said first frequency changing circuit means with the input of said second transmission gate means, the outputs of said first and second transmission gate means coupled with said receiver for supplying the signals passed thereby to such receiver for tuning the same;

sweep means coupled with said local oscillator means for causing said signal output therefrom to sweep through a band of frequencies to cause the output of said combfilter circuit means to change sharply for each different frequency, $nf$;

channel number selection means coupled with said first and second transmission gates to cause a selected one of said gates to be enabled to pass the signals from said local oscillator means in accordance with the band of frequencies to which the selected channel is assigned;

counter means coupled with the output of said combfilter circuit means for counting changes of output signal level from said combfilter circuit means;

comparision circuit means coupled with the output of said channel number selection means and with the output of said counter means for stopping said sweep means to maintain said local oscillator means at a selected frequency whenever a predetermined relationship between the count from said counter means and the output of said channel number selection means exists; and phase comparator means having a first input coupled with the output of said local oscillator means and having a second input coupled with the output of said combfilter circuit means for supplying a control signal to said local oscillator means to maintain operation thereof at said selected frequency when said sweep means is stopped.

9. The combination according to claim 8 wherein said combfilter means is a surface acoustic wave filter.

10. The combination according to claim 8 further including a 90° phase shift circuit coupled between the output of said local oscillator means and the first input of said phase comparator means and wherein said local oscillator means is a voltage controlled oscillator, the frequency of which is controlled by the magnitude of a control voltage applied thereto; and said sweep means applies a control voltage which varies from an initial amount to some predetermined maximum amount.

11. The combination according to claim 8 further including a read only memory translator circuit means, wherein said predetermined frequency spacing $f$ of said combfilter circuit means is 6 megahertz and said memory translator circuit means is coupled with said channel number selection means and comprises means coupling said comparision circuit means with the output of said channel number selection means for providing an output to said comparison circuit means for comparison with the output from said counter which corresponds to the number of 6 megahertz frequency spacings necessary to cause the output frequency from said oscillator to be the correct output frequency for the particular channel number in the band of frequencies selected by the enabled one of said transmission gates.

12. The combination according to claim 8 further including a third transmission gate means and a second frequency changing circuit means, with the output of said voltage controlled oscillator being applied to said third transmission gate means through said second frequency changing circuit means, the output of said third transmission gate means being coupled in common with the outputs of said first and second transmission gate means with said receiver; and said channel number selection means further being coupled with said third transmission gate means for enabling said third transmission gate means in response to the selection of channel numbers by said channel number selection means corresponding to channels in the band of frequencies represented by said third transmission gate means.

13. The combination according to claim 12 wherein said first and second frequency changing circuit means comprise first and second frequency dividers, respectively.

14. The combination according to claim 13 wherein said first frequency divider is a divide-by-3 frequency divider and the output of said first frequency divider is coupled with the input of said second frequency divider which is a divide-by-2 frequency divider; the output frequency of said voltage controlled oscillator is swept through a frequency band corresponding to local oscillator frequencies for the UHF television band, and said sweep means causes said voltage controlled oscillator to commence a frequency sweep from a minimum frequency each time a different channel number is selected by said channel number selection means.

15. The combination according to claim 14 wherein said first transmission gate means is enabled to pass signals for selection of UHF channels by said channel number selection means, said second transmission gate means is enabled to pass signals for selection of high-band VHF channels, and said third transmission gate means is enabled to pass signals for selection of low-band VHF channels.

16. The combination according to claim 15 further including a read only memory translator coupling the output of said channel number selection means with said comparison circuit means for providing a translated output count to said comparison circuit means corresponding to the number of counts of said predetermined frequency spacings $f$ for comparison with the output count from said counter means necessary to cause the output frequency from said local oscillator means to be the correct output frequency for the particular channel number selected by said channel number selection means, said count being the same for at least some channels in different bands.

* * * * *

UNITED STATES PATENT AND TRADEMARK OFFICE

CERTIFICATE OF CORRECTION

PATENT NO. : 3,913,020

DATED : October 14, 1975

INVENTOR(S) : Peter Van Anrooy

It is certified that error appears in the above-identified patent and that said Letters Patent are hereby corrected as shown below:

In Claim 1, Column 10, line 3, "seep" should be changed to --sweep--.

Signed and Sealed this

*twentieth* Day of *January 1976*

[SEAL]

*Attest:*

RUTH C. MASON
*Attesting Officer*

C. MARSHALL DANN
*Commissioner of Patents and Trademarks*